(12) United States Patent
Mayer et al.

(10) Patent No.: US 9,612,279 B2
(45) Date of Patent: Apr. 4, 2017

(54) SYSTEM AND METHOD FOR DETERMINING OPERATIONAL ROBUSTNESS OF A SYSTEM ON A CHIP

(71) Applicant: Infineon Technologies AG, Neubiberg (DE)

(72) Inventors: Albrecht Mayer, Deisenhofen (DE); Simon Brewerton, Trowbridge (GB)

(73) Assignee: Infineon Technologies AG, Neubiberg (DE)

( * ) Notice: Subject to any disclaimer, the term of this patent is extended or adjusted under 35 U.S.C. 154(b) by 997 days.

(21) Appl. No.: 13/777,132

(22) Filed: Feb. 26, 2013

(65) Prior Publication Data

US 2014/0239987 A1 Aug. 28, 2014

(51) Int. Cl.
*G01R 31/28* (2006.01)
*G01R 31/3177* (2006.01)

(52) U.S. Cl.
CPC ..... *G01R 31/2894* (2013.01); *G01R 31/3177* (2013.01)

(58) Field of Classification Search
CPC ............ G01R 31/2894; G01R 31/3177; H01L 2924/01006; G01N 2800/2871
USPC ... 324/750.3, 500, 526, 533, 757.05, 762.06
See application file for complete search history.

(56) References Cited

U.S. PATENT DOCUMENTS 7,055,117 B2 * 5/2006 Yee .................. G01R 31/31705
714/E11.214
2013/0103935 A1 * 4/2013 Maddigan ............. G06F 1/3206
713/2

* cited by examiner

*Primary Examiner* — Melissa Koval
*Assistant Examiner* — Trung Nguyen
(74) *Attorney, Agent, or Firm* — Eschweiler & Potashnik, LLC

(57) ABSTRACT

A system and method for determining operational robustness of a system on a chip (SoC) includes modifying one or more internal states of the SoC, during operation of the SoC, to mimic an effect which one or more disturbances have on the SoC, generating one or more signal traces that correspond to at least one internal state of the SoC after modifying the one or more internal states of the SoC, and determining if the operation of the SoC is stable based on the one or more generated signal traces.

29 Claims, 3 Drawing Sheets

SYSTEM AND METHOD FOR DETERMINING OPERATIONAL ROBUSTNESS OF A SYSTEM ON A CHIP

FIELD

Certain embodiments of the disclosure relate to determining operational robustness of a system on a chip (SoC). More specifically, certain embodiments of the disclosure relate to systems and methods for modifying internal states of a SoC, during operation of the SoC, to mimic the effect disturbances have on the SoC which may cause transient and permanent failures, for determining the robustness of the SoC to such disturbances.

BACKGROUND

Soft errors may occur in an electrical circuit due to, for example, radioactive decay or cosmic radiation. In safety-critical systems, such errors need to be detected and their effects mitigated. A safety-critical system associated with automotive systems include airbag and anti-collision systems, for example.

The ISO26262 is a functional safety standard intended to be applied to electrical and/or electronic systems installed in series production passenger cars with a maximum gross weight restriction. The standard aims to address possible hazards caused by malfunctioning behavior of electronic and electrical systems. The Automotive Safety Integrity Level (ASIL, defined by ISO26262) specifies the necessary safety measures for avoiding unreasonable risk. There are four ASIL levels (A-D), where D represents the most stringent level and A the least stringent level of a given safety function.

The ISO26262 standard requires proof of diagnostic coverage of 99% of the components of a safety-critical electrical system for single events and 90% for dual events, where a single event may involve an error in a single transistor associated with the safety-critical electrical system, and a dual event may involve two independent single events occurring at the same time. In addition, the standard requires proof that events which are assumed not to disturb the system actually do not disturb the system.

Conventional models and simulations have been used to demonstrate that chosen mitigation measures are effective. For example, one approach is to use an accurate design model, such as a register-transfer level (RTL) which models digital circuits in terms of the flow of digital signals between hardware registers and the logical operations performed on those signals. However, RTL is typically very slow in simulation speed and cannot be used for complex chips. Another approach is to manipulate the scan chain of a chip (i.e., setting and observing every flip-flop in the chip). However, in order to implement the scan chain, processing by the chip and any surrounding systems linked to the chip must be temporarily suspended. This is frequently not possible, nor is it necessarily desirable. Another problem is that implementation of scan chain read and write features presents severe security holes. Furthermore, utilization of models and simulations is not the same as utilization of a real system operating in a real environment, and based at least upon the above problems, cannot achieve the same sort of accuracy for determining system robustness.

A SoC, such as a microcontroller, an application-specific integrated circuit (ASIC) and a field-programmable gate array (FPGA), typically include a debugging system that identifies software issues and profiles real-time behavior by tracing internal operations. SoCs used for safety or security systems typically employ hardware and software mechanisms to detect failures in their desired operations due to internal or external influences. Since the ISO26262 functional safety standard requires a high certainty that software and hardware integration and system level reactions to failures are working as intended, it is desirable to verify that failures which occur in the lowest level hardware of operable SoCs are detected by failure-detection hardware, reported to failure-detection software, and handled (i.e., mitigated) by an application.

It would also be advantageous to provide solutions that reduce power consumption and area related to the integration of redundant-type structures inside high integrity electronic systems while retaining a high level of error detection provided by such redundant-structures. It is also of interest to provide redundant-type structures that detect internal faults and faults at output lines during normal operation.

SUMMARY

According to an embodiment of the disclosure, a method for determining operational robustness of a system on a chip (SoC) comprises modifying one or more internal states of the SoC, during operation of the SoC, to mimic the effect which one or more disturbances have on the SoC. The method further comprises generating one or more signal traces that correspond to at least one internal state of the SoC, and determining if the operation of the SoC is stable based on the one or more generated signal traces.

According to a further embodiment of the disclosure, a SoC comprises a microprocessor, a plurality of memories coupled to the microprocessor via a memory bus, a plurality of peripherals coupled to the microprocessor via a system bus, and a bugger/stresser module coupled to the system bus. In one embodiment, the bugger/stresser module is configured to modify one or more internal states of the SoC, during operation of the SoC, to mimic the effect which one or more disturbances have on the SoC, generate one or more signal traces that correspond to at least one internal state of the SoC, and determine if the operation of the SoC is stable based on the one or more generated signal traces.

DETAILED DESCRIPTION

The present disclosure, according to one embodiment, provides a system and method for injecting transient failures (i.e., soft failures) and/or permanent (i.e., static) failures (i.e., hard failures) into a running SoC system and observing the resulting effects. The transient and/or permanent failures may include microcontroller (μC) failures which typically require software processing to fulfill the ASIL D requirement. For example, soft or hard failures may be injected into a core processor (e.g., a microprocessor) of the microcontroller. Soft or hard failures may be injected as well into memory, such as SRAM, peripheral RAM, FLASH or any corresponding error correcting codes (ECC), which not only models failures in memory cells, but may also model failure of address decoding of a specific address(es).

Figure 1:
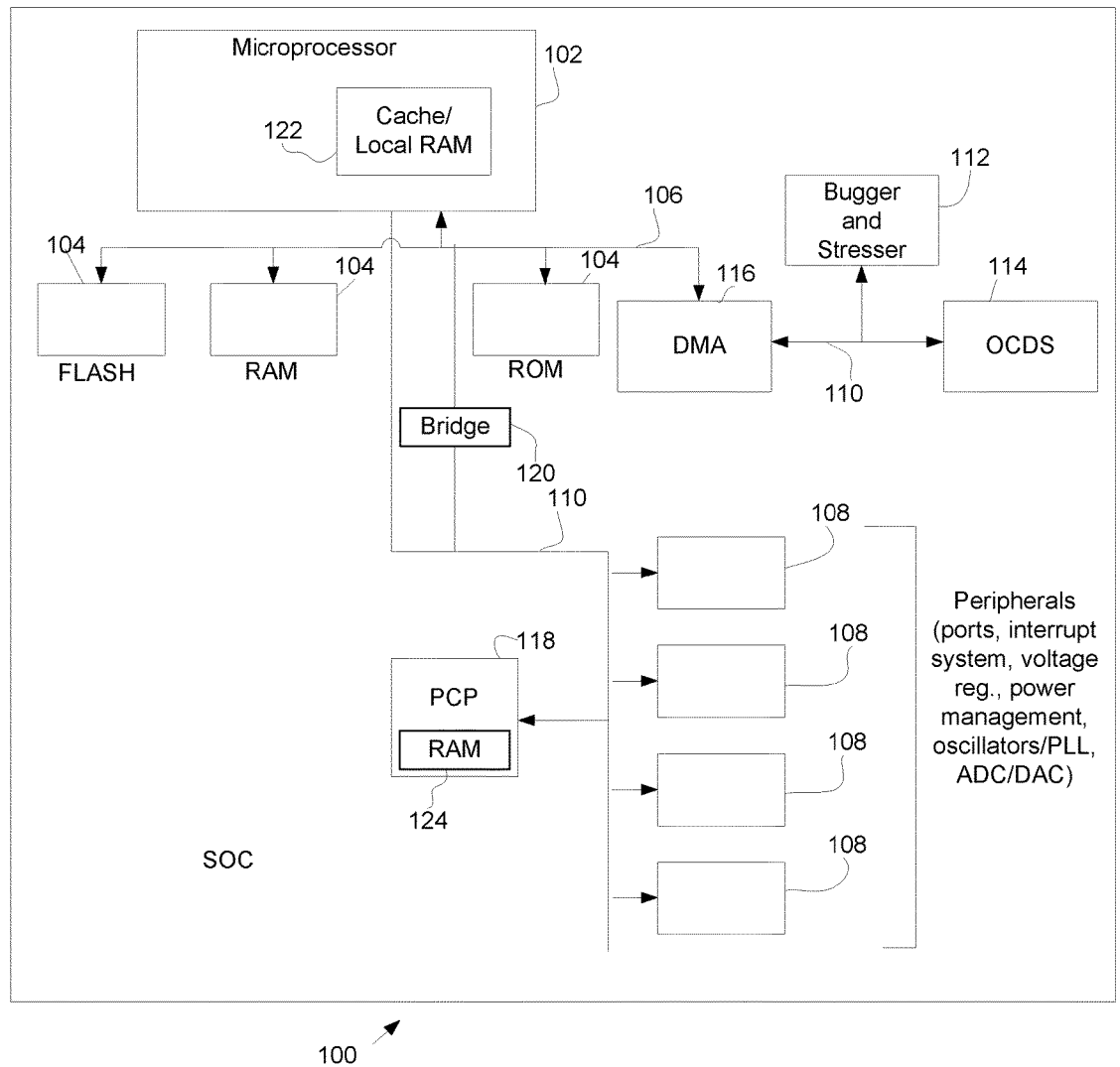
FIG. 1 is a schematic diagram of a system on a chip, according to an embodiment of the disclosure.

FIG. 1 is a schematic diagram of a SoC 100, according to an embodiment of the disclosure. The SoC 100 includes a microprocessor 102, also referred to as a central processing unit (CPU), a plurality of memories 104 coupled to the microprocessor 102 via a memory bus 106, a plurality of peripherals 108 coupled to the microprocessor 102 via a system bus 110, and a bugger/stresser module 112 coupled to the system bus 110. The SoC 100 optionally includes an on chip debug system (OCDS) 114, a direct memory access controller (DMA) 116, a peripheral control processor (PCP) 118, and a bridge 120 between the system bus 110 and the memory bus 106. The microprocessor 102 optionally includes internal microprocessor memory 122 and the peripheral control processor 118 optionally includes internal peripheral processor memory 124, both of which may comprise cache and/or RAM.

The plurality of peripherals 108 include, for example, I/O ports, analog-to-digital converters, digital-to-analog converters, oscillators, phase-locked loops, power management modules, voltage regulators, and interrupt systems. However, the scope of the present disclosure includes any type of peripheral typically associated with SoC architectures.

Figure 2:
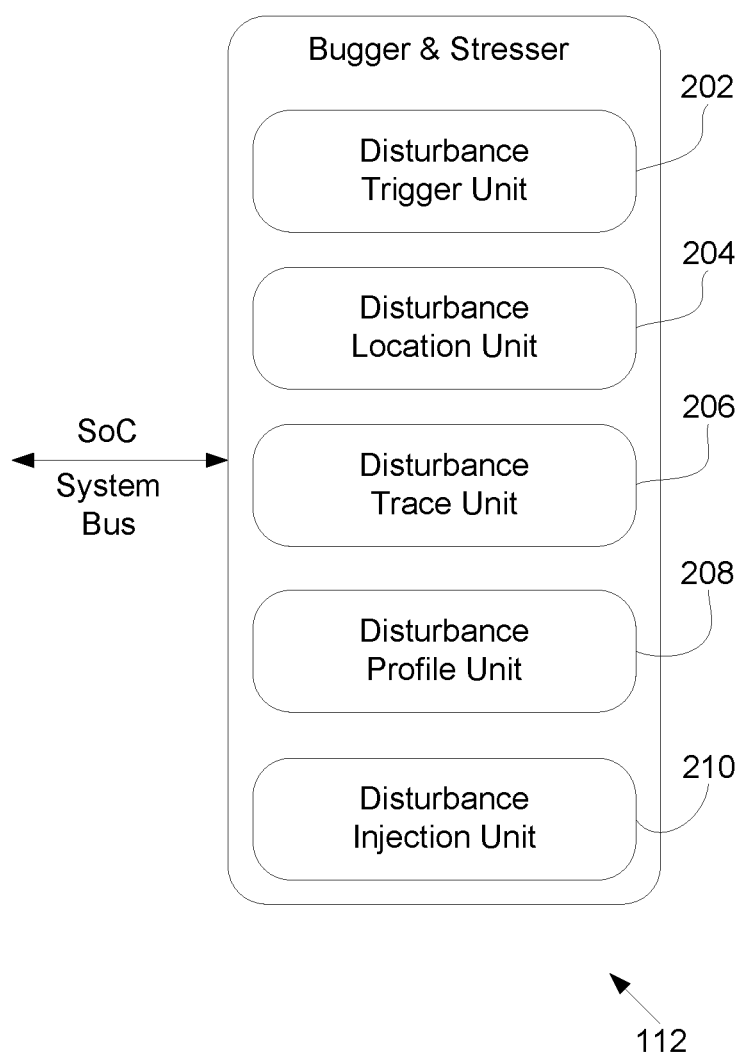
FIG. 2 is a schematic diagram of the bugger/stresser module illustrated in FIG. 1, according to an embodiment of the disclosure.

FIG. 2 is a schematic diagram of the bugger/stresser module 112 illustrated in FIG. 1, according to an embodiment of the disclosure. The bugger/stresser module 112 includes a disturbance trigger unit 202, a disturbance location unit 204, a disturbance trace unit 206, a disturbance profile unit 208, and a disturbance injection unit 210.

In one embodiment of the disclosure, the bugger/stresser module 112 determines how robust the SoC 100 is to disturbances (i.e. how the hardware and and/or application software reacts to such disturbances). The microprocessor 102 is configured to execute instructions of the application software. Application software comprises all types of applications which are associated with SoC systems, including applications which analyze and/or mitigate system failures caused by disturbances, for example.

According to one embodiment of the disclosure, the disturbance injection unit 210 of the bugger/stresser module 112 is configured to modify one or more internal states of the SoC 100 in order to mimic the effect that one or more disturbances would otherwise have on the SoC 100. The disturbances typically have sources which may be both internal and external to the SoC 100. For example, disturbances to operation of the SoC 100 include electrostatic discharges (ESDs), bulk current injections, radio frequency interference (RFI), clock disturbances, supply voltage disturbances, temperature disturbances, as well as failure of memory cells (also referred to as memory locations) of any of the plurality of memories 104, or internal memories 122 and 124 associated with the SoC processors, or memories associated with one or more of the plurality of peripherals 108. In one embodiment, the disturbance injection unit 210 is configured to have electrical access to a plurality of internal states of the SoC 100 and to modify one or more of the internal states.

The disturbance injection unit 210 may be configured to modify one or more of the internal states of the SoC 100 for emulating either a transient failure or a permanent failure. In emulating a transient failure, the disturbance injection unit 210 may, in one embodiment, read a value of an internal state and write a different internal state value back. In effect, this abrupt change to an internal state models a transient failure caused, for example, by cosmic radiation or radio-active decay interacting with the SoC 100. The scope of the disclosure covers other sources or causes, internal or external to the SoC 100, which result in transient failures.

In emulating a permanent failure, the disturbance injection unit 210 may, in one embodiment, monitor for when an internal state changes its state from a first value to a second value, and then write back the first value as the internal state value. In effect, since the internal state value is essentially held constant over time, the disturbance injection unit 210 models a permanent failure.

In one embodiment, an internal state of the SoC 100 comprises a state of a corresponding programmable memory location (e.g., a programmable memory cell) of a memory of one of the plurality of memories 104, or of a memory of a peripheral 108. The internal state of the SoC 100 may also comprise a state of the microprocessor 102, represented, for example, by a state of a particular programmable memory cell of the internal microprocessor memory 122. The internal state of the SoC 100 may also comprise any node voltage or node current associated with any electrical component of the SoC 100, such as the CPU core, bridge, PCP, DMA, OCDS, peripheral, or bus. A state of a bus (e.g., memory bus 106 and system bus 110) may also include the state of traffic (e.g., quantity or flow rate) on the bus.

According to one embodiment, one or more of the memories of the plurality of memories 104, internal memories 122 and 124, and memories associated with the plurality of peripherals 108, include flip flops, where each flip flop represents a programmable memory cell. The disturbance injection unit 210 may modify an internal state of the SoC for emulating either a transient failure or a permanent failure by manipulating a bit stored in a programmable memory cell (e.g., manipulating the state represented by a flip flop).

In addition, the disturbance injection unit 210 may modify an internal state of the SoC by modifying the state of traffic on the system bus 110 and/or memory bus 106, or by modifying any node voltage or node current associated with any electrical component of the SoC 100. In one embodiment, the disturbance injection unit 210 may modify any number of internal states, for emulating any combination of transient and/or permanent failures at the same time or at different times, where the internal states may be any combination of internal states of the SoC 100 as represented by, for example, voltages, currents, bit values, preventing CPU interrupts, triggering CPU interrupts, state of traffic on the buses and bus arbitration procedures. However, the scope of the disclosure covers other states of the SoC 100 which may be represented by any measurable electrical state of any component of the SoC 100.

By way of example embodiments, the disturbance injection unit 210 may modify an internal state of the SoC 100 by preventing an interrupt signal from interrupting processing of instructions by a core processor (e.g., microprocessor 120) of the SoC 100, and/or generating a false interrupt signal for interrupting processing of instructions by the core processor of the SoC 100, and/or disabling arbitration to the memory bus 106 of the SoC 100 for a programmable period of time, and/or adding extra traffic or restricting traffic on one or more of the buses 106 and 110 of the SoC 100, where traffic may comprise data or control messages, and/or preventing a peripheral 108 of the SoC 100 from gaining access to a bus 106 and 110 of the SoC 100, and/or modifying clock edges of clock signals generated by clocks of the SoC, and/or slowing access of the microprocessor 102 of the SoC 100 (and/or the peripheral control processor 118 of the SoC 100) to a resource of the SoC 100.

The disturbance injection unit 210 may also modify an internal state of the SoC 100 by disrupting signal communications within the SoC, including breaking an SoC connection over which SoC signals are transmitted, crossing a plurality of SoC connections with each other, and adding additional signal transitions onto existing SoC signals.

According to one embodiment, a non-inclusive list of resources of the Soc 100 includes a memory of the plurality of memories 104, an internal memory 122 and 124, a peripheral of the plurality of peripherals 108, a bus (i.e., system bus 110 and memory bus 106), the DMA 116, and the PCP 118.

The disturbance trace unit 206 of the bugger/stresser module 112 generates one or more signal traces that correspond to one or more internal states of the SoC 100, and may also determine if the operation of the SoC 100 is stable based on the one or more generated signal traces. In one embodiment, one or more of the internal states of the SoC 100 (to which the signal traces correspond) correspond to the locations of one or more of the internal states that were modified by the disturbance injection unit 210. In another embodiment, none of the internal states of the SoC 100 (to which the signal traces correspond) correspond to the locations of the internal states that were modified by the disturbance injection unit 210.

In one embodiment of the disclosure, the signal traces that are generated by the disturbance trace unit 206 include a first set of signal traces that log any combination of voltages, currents, bit values, data access requests and bus traffic, for example, at the locations (e.g., nodes) in the SoC 100 at which the internal states were modified, and a second set of signal traces that log any combination of voltages, currents, bit values, data access requests and bus traffic, for example, at other locations in the SoC 100 at which the internal states were not modified by the disturbance injection unit 210. The signal traces are, in one embodiment, generated for a predetermined, or alternatively a programmable, duration of time which includes the point of time at which the modification was performed by the disturbance injection unit 210.

According to another embodiment of the disclosure, the disturbance trace unit 206 does not analyze the traces, but instead sends the traces to another on chip (or off chip) module for analysis. The analysis of the traces may include determining whether operation of the SoC 100 is stable in the sense of whether the injected failures (i.e., the modifications) were detected by fault detection hardware of the SoC 100, reported to fault detection software, and mitigated properly by the fault detection software or by any other application being executed by the microprocessor 102 of the SoC 100 for this purpose. In one embodiment, the on chip debug system (OCDS) 114 (FIG. 1) comprises conventional fault detection hardware. In a further embodiment, the OCDS 114 is an on chip module adapted to analyze the traces to determine whether operation of the SoC 100 is stable.

According to a further embodiment of the disclosure, the disturbance trigger unit 202 is configured to trigger the disturbance injection unit 210 to modify one or more internal states (also referred to as injecting one or more failures) based upon a time, a SoC system mode, an occurrence of an interrupt, an occurrence of a trap, or an occurrence of an event, for example, or any other programmable criteria or any combination of programmable criteria. In one embodiment, the disturbance trigger unit 202 is configured to trigger the disturbance injection unit 210 to modify one or more internal states by sending the disturbance injection unit 210 the trigger criteria.

According to an embodiment of the disclosure, the disturbance profile unit 208 is configured to control the disturbance injection unit 210 to modify the internal states with a particular spatial pattern and/or temporal pattern. For example, in one example embodiment, once the disturbance trigger unit 202 has triggered the disturbance injection unit 210 to inject one or more failures, the disturbance profile unit 208 controls the temporal pattern of the injected failures by, for example, directing the disturbance injection unit 210 to inject the failures at a particular frequency, or randomly over time, or with a predetermined pattern over time, or continuously over a particular time interval, or at one time only, or with a Gaussian pattern over time, or with a white noise pattern over time, or with a pattern over time determined by a mathematical manipulation (i.e., a mathematical function) of data associated with the SoC, such as data stored on the SoC or even data represented by internal states of the SoC.

The disturbance profile unit 208 may also control the spatial pattern of the injected failures by, for example, directing the disturbance injection unit 210 to inject failures at a particular frequency over space (of the SoC or of a particular component of the SoC (e.g., over a particular periodic spatial pattern of memory cells), or randomly over space, or with a Gaussian pattern over space, or with a white noise pattern over space, or with a pattern over space determined by a mathematical manipulation (i.e., a mathematical function) of data associated with the SoC. In a further embodiment, the particular spatial patterns and/or temporal patterns may themselves be functions of time, or physical locations or addresses of the internal states of the SoC 100 being modified. In another embodiment, the disturbance profile unit 208 is configured to control the disturbance injection unit 210 to inject failures with a particular spatial pattern and/or temporal pattern by sending spatial pattern and/or temporal pattern information to the disturbance injection unit 210.

In another embodiment of the disclosure, the disturbance location unit 204 is configured to set boundary ranges for locations of the SoC internal states that are to be modified and/or to set boundary ranges for locations of the SoC internal states that are not to be modified. In one embodiment, the disturbance location unit 204 sends boundary range information to the disturbance injection unit 210.

According to a further embodiment of the disclosure, the disturbance injection unit 210 uses one or more of the received trigger criteria, spatial pattern and/or temporal pattern information, and boundary range information to modify one or more internal states of the SoC 100. The scope of the present disclosure includes a bugger/stresser module 112 which comprises the disturbance injection unit 210 and any combination of disturbance trigger unit 202, disturbance location unit 204, disturbance trace unit 206 and disturbance profile unit 208. In addition, the scope of the present disclosure also includes any combination of the functionality of the five units of the bugger/stresser module 112 comprised in one or more of the units.

Figure 3:
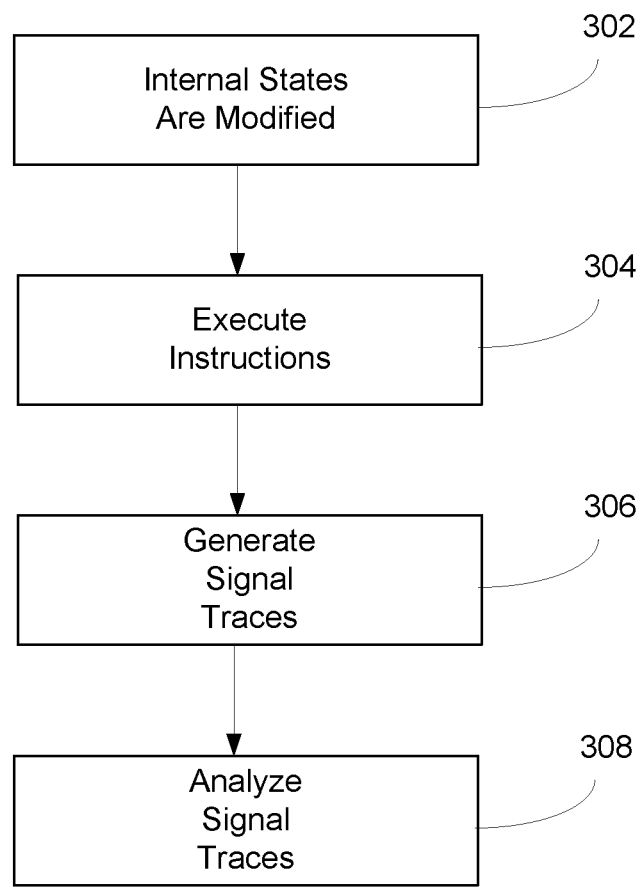
FIG. 3 is a flowchart of a method for determining operation robustness of a system on a chip, according to an embodiment of the disclosure.

FIG. 3 is a flowchart 300 of a method for determining operation robustness of a system on a chip (SoC), according to an embodiment of the disclosure.

At 302, during operation of the SoC 100, one or more internal states of the SoC 100 are modified to mimic the effect that one or more disturbances would otherwise have on the SoC 100. In one embodiment, the disturbances may mimic effects that would originate from external and/or internal sources, and may include an electrostatic discharge (ESD), a bulk current injection, radio frequency interference (RFI), a clock disturbance, a supply voltage disturbance, a temperature disturbance and a failure of a memory cell. However, the scope of the present disclosure covers all types of internal and/or external sources of disturbances which may have an effect on the internal states of the SoC 100.

At 304, a microprocessor 102 of the SoC 100 (or any other core processor of the SoC 100) executes one or more instructions from a set of instructions of a particular application. At 306, one or more signal traces that correspond to at least one internal state of the SoC 100 are generated during operation of the SoC (e.g., as the SoC executes the particular application). In one embodiment, an internal state to which a signal trace corresponds is the same internal state (and may correspond to the same location within the SoC) that was initially disturbed. In another embodiment, the internal state to which the signal trace corresponds is a different internal state (and corresponds to a different location within the SoC) that was initially disturbed.

At 308, the one or more generated signal traces are analyzed to determine whether the operation of the SoC 100 is stable. In one embodiment, the generated signal traces are compared to predetermined corresponding signal traces for determining whether the operation of the SoC 100 is stable.

In one embodiment, the predetermined corresponding signal traces are traces that were previously generated before the one or more internal states of the SoC 100 were modified (i.e., before step 302). For example, previous to act 302, the microprocessor 102 executes the same one or more instructions from the set of instructions, the disturbance trace unit 206 generates the predetermined corresponding signal traces that correspond to the same one or more internal states of the SoC. In one embodiment, the predetermined corresponding signal traces are stored in a memory of the SoC 100. In another embodiment, the predetermined corresponding signal traces are generated as part of the manufacture of the SoC 100, and stored in a memory of the SoC 100.

The present disclosure provides an independent on-chip control unit which can be programmed to perform failure injections or to apply stress (i.e., modify one or more internal states of the SoC) based on simple or complex conditions. A failure injection (i.e., an injection of a single failure) may occur, for example, when a bit value is changed, whereas the application of stress may include the injection of a plurality of single failures.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method for determining operational robustness of a system on a chip (SoC), comprising:
    during operation of the SoC, manipulating one or more bits of data stored in one or more programmable memory locations to mimic an effect which one or more disturbances have on the SoC;
    generating one or more signal traces that correspond to at least one internal state of the SoC after manipulating the one or more bits of data stored in one or more programmable memory locations; and
    determining if the operation of the SoC is stable based on the one or more generated signal traces.

2. The method according to claim 1, wherein the one or more disturbances correspond to disturbance sources which are internal and/or external to the SoC.

3. The method according to claim 2, wherein the one or more disturbances correspond to disturbance sources that comprise one or more of an electrostatic discharge (ESD), a bulk current injection, radio frequency interference (RFI), a clock disturbance, a supply voltage disturbance, a temperature disturbance and a failure of a memory cell.

4. The method according to claim 1, comprising manipulating the one or more bits of data to emulate a transient failure.

5. The method according to claim 4, wherein the manipulating the one or more bits of data comprises reading a value of the one or more bits and writing a different value to the corresponding programmable memory location.

6. The method according to claim 1, comprising manipulating the one or more bits of data to emulate a permanent failure.

7. The method according to claim 6, comprising monitoring for when the one or more bits of data changes its state from a first value to a second value, and writing back the first value to the one or more bits of data.

8. The method according to claim 1, wherein the one or more programmable memory locations comprise one or more corresponding programmable memory locations associated with one or more peripherals of the SoC.

9. The method according to claim 1, further comprising modifying one or more states of one or more corresponding flips-flops of the SoC to mimic an effect which one or more disturbances have on the SoC.

10. The method according to claim 1, further comprising disrupting signal communications within the SoC to mimic an effect which one or more disturbances have on the SoC.

11. The method according to claim 10, wherein disrupting signal communications within the SoC comprises one or more of breaking an SoC connection, crossing a plurality of SoC connections with each other, and adding additional signal transitions onto existing SoC signals.

12. The method according to claim 1, further comprising preventing an interrupt signal from interrupting processing of instructions by a microprocessor of the SoC to mimic an effect which one or more disturbances have on the SoC.

13. The method according to claim 1, further comprising generating a false interrupt signal for interrupting processing of instructions by a microprocessor of the SoC to mimic an effect which one or more disturbances have on the SoC.

14. The method according to claim 1, further comprising disabling arbitration to a memory bus of the SoC for a programmable period of time to mimic an effect which one or more disturbances have on the SoC.

15. The method according to claim 1, further comprising adding extra traffic on one or more buses of the SoC to mimic an effect which one or more disturbances have on the SoC.

16. The method according to claim 1, further comprising losing access, by a peripheral of the SoC, to a bus of the SoC to mimic an effect which one or more disturbances have on the SoC.

17. The method according to claim 1, further comprising modifying clock edges of clock signals generated by clocks of the SoC to mimic an effect which one or more disturbances have on the SoC.

18. The method according to claim 1, further comprising slowing access, by a microprocessor of the SoC, to a resource of the SoC to mimic an effect which one or more disturbances have on the SoC.

19. The method according to claim 18, wherein the resource of the Soc comprises one or more of one or more memories of the SoC and one or more peripherals of the SoC.

20. The method according to claim 1, wherein the operation of the SoC comprises processing, by a microprocessor of the SoC, a set of one or more instructions.

21. The method according to claim 20, wherein the at least one internal state is generated after processing, by the microprocessor of the SoC, at least one instruction from the set of one or more instructions after modification of the one or more internal states of the SoC.

22. The method according to claim 21, wherein determining if the operation of the SoC is stable is based on comparing the one or more generated traces with one or more predetermined traces.

23. The method according to claim 22, wherein the one or more predetermined traces correspond to the at least one internal state of the SoC, wherein the at least one internal state is generated after processing, by the microprocessor of the SoC, the at least one instruction from the set of one or more instructions before the manipulation of the one or more bits of data.

24. The method according to claim 1 further comprising manipulating the one or more bits of data based upon a trigger event.

25. The method according to claim 24, wherein the trigger event comprises one or more of a change to a monitored state of the SoC, a time trigger, and an interrupt signal.

26. The method according to claim 24, further comprising determining a pattern of manipulation of the one or more bits of data, based upon one or more of time of occurrence of the trigger event, a physical location of the one or more programmable memory locations, and an address of the one or more programmable memory locations.

27. The method according to claim 26, wherein the pattern of modification comprises one of a periodic pattern, a predetermined pattern, a random pattern, a Gaussian pattern, a white noise pattern and a pattern of mathematical manipulation of data associated with the SoC.

28. A system for determining operational robustness of a system-on-a-chip (SoC), comprising:
  circuitry adapted to, during operation of the SoC, manipulate one or more bits of data stored in one or more programmable memory locations of the SoC to mimic an effect which one or more disturbances have on the SoC;
  circuitry adapted to generate one or more signal traces that correspond to at least one internal state of the SoC after manipulating the one or more bits of data; and
  circuitry adapted to determine if the operation of the SoC is stable based on the one or more generated signal traces.

29. A method for determining operational robustness of a system on a chip (SoC), comprising:
  modifying one or more internal states of the SoC to mimic an effect which one or more disturbances have on the SoC during processing of a set of one or more instructions by a microprocessor of the SoC;
  generating one or more signal traces that correspond to at least one internal state of the SoC after modifying the one or more internal states of the SoC; and
  determining if the operation of the SoC is stable based on the one or more generated signal traces,
  wherein the at least one internal state is generated after processing, by the microprocessor, of at least one instruction after modification of the one or more internal states of the SoC.

* * * * *